United States Patent [19]

Boubouleix

[11] 4,317,230
[45] Feb. 23, 1982

[54] BROAD-BAND PASSIVE RING MIXER

[75] Inventor: Albert Boubouleix, Paris, France

[73] Assignee: Thomson-CSF, Paris, France

[21] Appl. No.: 103,152

[22] Filed: Dec. 13, 1979

[30] Foreign Application Priority Data

Dec. 15, 1978 [FR] France ............................... 78 35387

[51] Int. Cl.³ ............................................. H04B 1/28
[52] U.S. Cl. ..................................... 455/319; 455/333
[58] Field of Search ............... 455/318, 319, 323, 326, 455/331, 333; 363/159; 332/24, 43 R, 43 B

[56] References Cited

U.S. PATENT DOCUMENTS

| 3,614,668 | 10/1971 | Sudoh ................................... 333/24 |
| 3,727,078 | 4/1973 | Wollesen ............................. 455/326 |
| 4,090,139 | 5/1978 | Hoover ............................... 455/333 |
| 4,193,036 | 5/1980 | Cerny, Jr. et al. .................. 455/333 |

Primary Examiner—Jin F. Ng
Attorney, Agent, or Firm—Cushman, Darby & Cushman

[57] ABSTRACT

Mixer which has, in place of four conventional diodes, the collector - emitter spaces of transistors polarized to earth and supplied at their bases by the local oscillating signal across a coupling system and as a result giving performance levels like those obtained with diodes, but with a lower local oscillating power.

4 Claims, 2 Drawing Figures

FIG_1
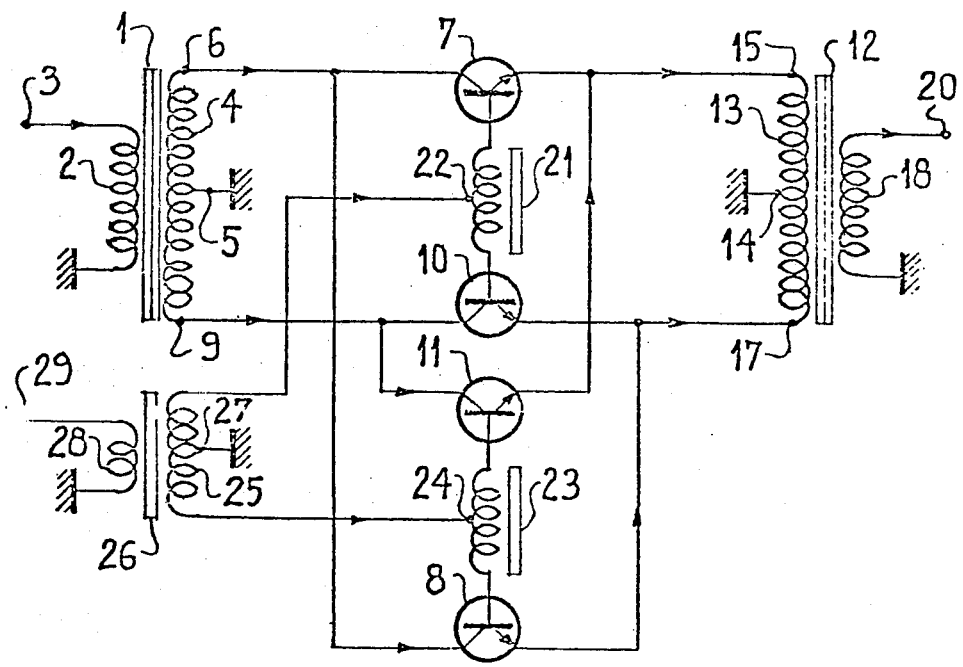
FIG_2
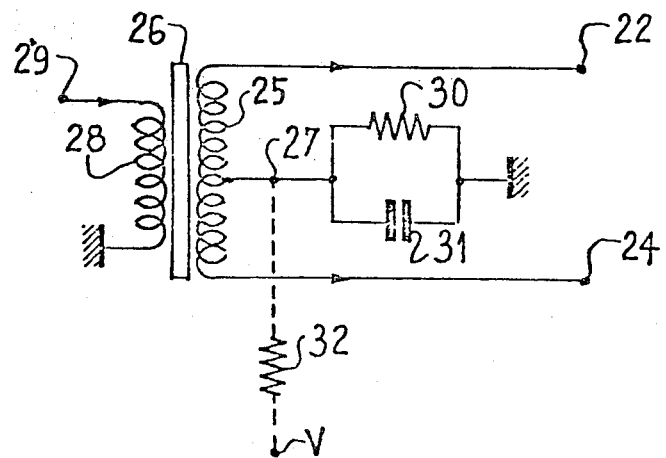

BROAD-BAND PASSIVE RING MIXER

BACKGROUND OF THE INVENTION

The invention relates to broad-band, passive ring mixers, particularly those used as input mixers in meters or decimeter wave receivers.

Diode ring modulators and in particular those having a ring with four identical diodes are known to have good characteristics at high frequencies and in particular their circuits have a low impedance permitting a wide pass band. However, the satisfactory performances in intermodulation and transmodulation are dependent on an adequate local oscillating power.

At high frequencies, for example in the decimeter wave band, the overall efficiency of a local oscillator is low, approximately 10 to 15%, and portable and self-contained receivers suffer a considerable reduction in their operating autonomy due to their energy consumption needs for obtaining this adequate power.

Numerous ring mixer constructions are known, which use active transformers in place of diodes in order to improve their gain. They make it possible to reduce the local oscillating power, but the sought highly satisfactory linearity conditions are not obtained in any of these constructions due to the intrinsic defects of the active transistors, particularly the exponential characteristics of the base current as a function of the base-emitter voltage and the variations in the current amplification factor with that of the collector current. There are also balancing difficulties due to the dispersion of the characteristics.

BRIEF SUMMARY OF THE INVENTION

The present invention aims at obviating the disadvantages of transistorized ring mixers.

The ring mixer according to the invention comprises:

a first transformer having a primary which receives an incident signal and a symmetrical secondary having a centre and a first and a second end;

a second transformer having a secondary supplying the output signal of the mixer and a symmetrical primary having a centre, a first and a second end;

a first and a second semiconductor device respectively interconnecting the two first and the two second ends;

a third and a fourth semiconductor device respectively interconnecting the first end of the symmetrical secondary and the second end of the symmetrical primary and vice versa;

a symmetrical device for generating a local oscillating signal having an output;

a first coupling circuit having an input coupled to one of the outputs of the generating device and two outputs;

a second coupling circuit having an input coupled to the other of the two outputs of the generating device and two outputs;

the first, second, third and fourth devices being respectively the collector-emitter space of first, second, third and fourth transistors of the same type, the connection of said four transistors being such that each electrode of the same type is connected to the first or second end of the same transformer, the two outputs of the first circuit supplying in phase respectively the bases of the first and second transistors, the two outputs of the second circuit supplying in phase respectively the bases of the third and fourth transistors, the impedance at the frequency of the incident signal between each of the two outputs of each coupling device being high compared with the dynamic load impedances of the first and second transformers and the centres of the symmetrical primary and secondary being coupled to earth.

The advantages resulting from the present invention are a linearity equivalent to that of the diode mixer for a same incident signal level, but with a substantially reduced local oscillating signal power or an increased linearity for the same power of said latter signal compared with a diode mixer.

BRIEF DESCRIPTION OF THE DRAWINGS

The invention will be described in greater detail hereinafter relative to non-limitative embodiments and the attached drawings, wherein show:

FIG. 1 a general diagram of a ring mixer according to the invention.

FIG. 2 a variant of part of the diagram of FIG. 1.

DETAILED DESCRIPTION OF THE PREFERRED EMBODIMENTS

In FIG. 1, a transformer 1 has a primary 2, whose one end is connected to earth and whose other end is connected to a terminal 3 receiving the incident signal. Its symmetrical secondary 4 has a centre 5 connected to earth, a first end 6 connected to the collector of each transistor 7 and 8 and an end 9 connected to the collector of each of the transistors 10 and 11. A transformer 12 has a symmetrical primary 13, whose centre 14 is connected to earth and whereof one end 15 is connected to the emitter of each of the transistors 7 and 11, and another end 17 is connected to the emitters of transistors 10 and 8. Its secondary 18 has an end connected to earth and the other end is connected to an output terminal 20. The bases of transistors 7 and 10 are respectively connected to the two ends of a choke 21 having a centre 22. In the same way, the bases of transistors 11 and 8 are connected respectively to the two ends of a choke 23 having a centre 24. These centres 22 and 24 are connected to the ends of a secondary 25 of a transformer 26, whose centre 27 is connected to earth. Transformer 26 has a primary 28, whose one end is connected to earth and whose other end is connected to an input terminal 29 which serves to receive a local oscillating signal.

This mixer differs from the known four diode ring mixer on the one hand by the fact that each diode is replaced by the collector-emitter space of a transistor and on the other hand by the way in which the local oscillating voltage is applied to the transistors across passive coupling circuits (chokes 21 and 23).

The emitters and collectors of transistors 7, 10, 11 and 8 of the NPN type are polarised to earth, so that these transistors are saturated and their collector-emitter space is conductive, when their base is positive and conversely they are blocked when it is negative.

The local oscillating signal applied to the terminal 29 reaches in phase opposition the centres 22 and 24 of chokes 21 and 23, which are coiled with a strong coupling between turns and calculated in such a way as to have a high impedance to the incident signal applied to the terminal 3 to prevent any modification to the charge of secondary 4 and a low impedance to the local oscillating frequency applied to the centre thereof.

In the present embodiment, chokes 21 and 23 are made by winding onto a ferrite core the two halves of the choke in question with two hand wires.

Thus, pair of transistors 7, 10 is conductive and pair 11, 8 locked, when the local oscillating voltage is respectively positive at point 22 and negative at point 24, the situation of the transistors being reversed with the polarity of the local oscillating voltage.

The clipping of the incident signal by the local oscillating signal consequently takes place in the same way as in the diode mixer, with the very important exception that the local oscillating current no longer passes through the semiconductor ring. Instead, it supplies the base circuits of the transistors for controlling the collector currents, i.e. the currents due to the incident signal and which are approximately 10 times higher than the base current.

In the present embodiment, the transistors are of the NE 64535 type of NEC (Nippon Electric Company) with the following conditions of use:

Incident signal frequency: 400 MHz
Local oscillating signal frequency: 480 Mhz
Output signal frequency: 80 MHz
Power applied at the local oscillating frequency: +13 dBm.

The intermodulation level was 16 dB higher than that obtained with the best known diodes suitable for these frequencies, with which the same intermodulation performances would have required a local oscillating power some 8 dB higher.

When only moderate or low intermodulation performances are required, this leads to the use of low local oscillating powers in the presence of which the threshold of the junctions of the transistors is a reason for the reduction in the efficiency of the system. This can be obviated by a variation in the current supply by the local oscillating signal as shown in FIG. 2.

In FIG. 2, where the same reference numerals refer to the same components as in FIG. 1, the centre 27 of winding 25 is connected to earth across a resistor 30 decoupled by a capacitor 31. As a variant, centre 27 can be connected to a positive voltage source V across a resistor 32.

It is known that all semiconductor junctions have a potential barrier which is necessary to overcome in order to make the junction conductive. It is therefore necessary to reach a slightly positive base voltage (generally below IV) in order to start to make the collector-emitter space of transistors 7, 10, 11 or 8 conductive. This is obtained by self-biasing on the average base current of these four transistors across resistor 30. In this way, when the local oscillating level is low, the symmetry is maintained between the off-period and the on-period of the junctions, which thus effectively correspond to the times of the respectively negative and positive half-cycles of the local oscillating signal.

In order to obviate the use of a high-ohmic resistor 30 when the local oscillating level is particularly low, the self-biasing can be completed by fixed biasing of source V.

Obviously, other embodiments are possible without passing beyond the scope of the invention. In particular, the transistors can be of the PNP type instead of the NPN type, which obviously leads to the inversion of the polarity of a possible d.c. voltage source V. The chokes 21 and 23 which have centres can be replaced by any other known coupling member ensuring a high impedance with respect to the incident signal transmitted between the bases of the transistors in question and a low impedance with respect to the local oscillating signal between centres 22 or 24 and the bases of the transistors in question.

What is claimed is:

1. A ring mixer comprising:
    a first transformer having a primary winding adapted to receive an input signal to the mixer and a secondary winding having first and second ends and a center-tap, the center-tap being coupled to circuit ground;
    a second transformer having a secondary winding for supplying an output signal of the mixer and a primary winding having first and second ends and a center-tap, the center-tap being coupled to circuit ground;
    first, second, third, and fourth transistors, the collectors of the first and the third transistors being connected to the first end of the secondary winding of the first transformer, the collectors of the second and the fourth transistors being connected to the second end of the secondary winding of the first transformer, the emitters of the first and the fourth transistors being connected to the first end of the primary winding of the second transformer, the emitters of the second and the third transistors being connected to the second end of the primary winding of the second transformer;
    a symmetrical device for generating a local oscillating signal and having two outputs; p1 a first choke, having (a) a high coupling factor among the turns thereof, (b) a center tap coupled to one of the outputs of the symmetrical generating device and (c) two ends;
    a second choke, having (a) a high coupling factor among the turns thereof, (b) a center-tap coupled to the other of the two outputs of the symmetrical generating device and (c) two ends; the two ends of the first choke supplying in phase the bases of the first and second transistors, respectively, the two ends of the second choke supplying in phase the bases of the third and fourth transistors, respectively.

2. A ring mixer according to claim 1, wherein the symmetrical generating device comprises a transformer having a center-tapped secondary winding, the center-tap of which is coupled to ground and the two ends of which are respectively connected to the center-taps of the two chokes.

3. A ring mixer according to claim 1, wherein the symmetrical generating device comprises a transformer having a center-tapped secondary, the center-tap of which is coupled to ground across a resistor decoupled by a capacitor in parallel therewith and the two ends of which are respectively connected to the center-taps of the two chokes.

4. A ring mixer according to claim 3, wherein the symmetrical generating device further comprises a d.c. voltage source coupled to the center-tap of the secondary winding of its transformer.

* * * * *